United States Patent
Lee et al.

(10) Patent No.: US 7,868,467 B2
(45) Date of Patent: Jan. 11, 2011

(54) SEMICONDUCTOR DEVICE

(75) Inventors: Choong-Ho Lee, Seongnam-si (KR); Hee-Soo Kang, Yongin-si (KR); Kyu-Charn Park, Pyengtaek-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 204 days.

(21) Appl. No.: 12/167,875

(22) Filed: Jul. 3, 2008

(65) Prior Publication Data

US 2009/0014844 A1    Jan. 15, 2009

(30) Foreign Application Priority Data

Jul. 12, 2007    (KR) ...................... 10-2007-0069978

(51) Int. Cl.
*H01L 29/40* (2006.01)
(52) U.S. Cl. .................... 257/783; 257/782; 257/781; 257/780; 257/E21.514
(58) Field of Classification Search .......... 257/780–783
See application file for complete search history.

(56) References Cited

U.S. PATENT DOCUMENTS

| | | | |
|---|---|---|---|
| 5,461,774 A | 10/1995 | Holmes et al. | |
| 5,801,084 A * | 9/1998 | Beasom et al. | 438/457 |
| 6,308,938 B1 | 10/2001 | Futakuchi | |
| 2006/0141742 A1* | 6/2006 | Fournel et al. | 438/455 |
| 2007/0257336 A1* | 11/2007 | Matsumoto | 257/627 |

FOREIGN PATENT DOCUMENTS

| | | |
|---|---|---|
| JP | 11-102985 | 4/1999 |
| KR | 1999-0030681 | 7/1999 |

OTHER PUBLICATIONS

United States Patent No. 6,308,938 corresponding to Foreign Document No. JP 11-102985.

\* cited by examiner

*Primary Examiner*—Dung A. Le
(74) *Attorney, Agent, or Firm*—F. Chau & Associates, LLC

(57) ABSTRACT

A semiconductor device includes a first substrate, a plurality of cell transistors and a second substrate. The first substrate has a first surface and a second surface opposite to the first surface. The plurality of cell transistors is formed extending on the first surface of the first substrate in a direction. The second substrate has an upper surface making contact with the second surface of the first substrate. Further, the upper surface of the second substrate has a bent structure to apply tensile stresses to the first substrate in the extending direction of the plurality of cell transistors. Thus, tensile stresses may be applied to the first substrate to improve the mobility of carriers in a channel region of the cell transistors.

17 Claims, 4 Drawing Sheets

SEMICONDUCTOR DEVICE

PRIORITY STATEMENT

This application claims priority to Korean Patent Application No. 2007-69978 filed on Jul. 12, 2007, the contents of which are hereby incorporated by reference herein in their entirety.

BACKGROUND OF THE INVENTION

1. Technical Field

Exemplary embodiments of the present invention relate to a semiconductor device and a method of manufacturing the same. More particularly, exemplary embodiments of the present invention relate to a semiconductor device having improved mobility of carriers in a channel region, and to a method of manufacturing the semiconductor device.

2. Description of the Related Art

Generally, a semiconductor memory device may be classified as either a volatile memory device, such as a dynamic random access memory (DRAM) device, a static random access memory (SRAM) device that loses data over time, or a non-volatile memory device that continuously stores data over time. Data is rapidly inputted/outputted into/from the volatile memory device. In contrast, data is slowly inputted/outputted into/from the non-volatile memory device. The non-volatile memory device may include an electrically erasable programmable read-only memory (EEPROM) device, or a flash EEPROM memory device, capable of electrically inputting/outputting data. The EEPROM device and the flash memory device are both currently being widely used.

The non-volatile memory device in view of a circuit aspect may be classified as either a NAND type non-volatile memory device or a NOR type non-volatile memory device. The NAND type non-volatile memory device may include unit strings, which include cell transistors serially connected with each other, serially connected between a bit line and a ground line. The NOR type non-volatile memory device may include cell transistors parallely connected between a bit line and a ground line.

Further, the NAND type non-volatile memory device may include a plurality of gate structures constituting the cell transistor, ground selection lines, string selection lines, and common source lines arranged at peripheral regions of the gate structures. Each of the gate structures may include a gate electrode and an active region under the gate electrode.

A voltage may be applied to the common source lines at the peripheral region of the cell transistors to move carriers in the active region. The voltage may be transmitted into the gate structures of the cell transistors and the active region to store and/or erase data by moving the carriers in the active region. However, when there is an increase in the number of the cell transistors, the voltage applied from the peripheral region of the cell transistor may not be transmitted to central cell transistors. As a result, the mobility of the carriers corresponding to the voltage may be reduced.

SUMMARY OF THE INVENTION

Exemplary embodiments of the present invention may provide a semiconductor device having improved mobility of carriers in a channel region.

Exemplary embodiments of the present invention may also provide a method of manufacturing the above-mentioned semiconductor device.

In accordance with an exemplary embodiment of the present invention, a semiconductor device is provided. The semiconductor device includes a first substrate, a plurality of cell transistors and a second substrate. The first substrate has a first surface and a second surface opposite to the first surface. The plurality of cell transistors is arranged extending on the first surface of the first substrate in a direction. The second substrate has an upper surface making contact with the second surface of the first substrate. Further, the upper surface of the second substrate has a bent structure to apply tensile stresses to the first substrate in the extending direction of the plurality of cell transistors.

According to some exemplary embodiments of the present invention, the first substrate may include a fringe substrate having a $\{100\}$ crystal plane in a growing direction of single crystalline silicon. Further, the plurality of cell transistors may have a string structure extending in the $\{100\}$ crystal plane. Alternatively, the first substrate may include a fringe substrate having a $\{110\}$ crystal plane in a growing direction of single crystalline silicon.

According to some exemplary embodiments of the present invention, each of the plurality of cell transistors may include a tunnel oxide layer, a floating gate electrode, a dielectric layer and an upper electrode. Alternatively, each of the plurality of cell transistors may include a tunnel oxide layer, a charge trapping layer pattern, a dielectric layer and an upper electrode.

According to some exemplary embodiments of the present invention, the second substrate may include a printed circuit board (PCB) having conductive wirings.

According to some exemplary embodiments of the present invention, the upper surface of the second substrate may be convexed in a direction substantially the same as the extending direction of the cell transistors.

Alternatively, the upper surface of the second substrate may be convexed in a direction substantially perpendicular to the extending direction of the plurality of cell transistors.

In accordance with another exemplary embodiment of the present invention, a method of manufacturing a semiconductor device is provided. In the method, a plurality of cell transistors is formed extending on a first surface of a first substrate in a direction. A second substrate having a bent upper surface is prepared. The bent upper surface of the second substrate is contacted with a second surface of the first substrate opposite to the first surface to apply tensile stresses to the first substrate in the extending direction of the plurality of cell transistors.

According to some exemplary embodiments of the present invention, the plurality of cell transistors may be arranged on a fringe substrate, which has a $\{100\}$ crystal plane in a growing direction of single crystalline silicon, in the $\{100\}$ crystal plane. Alternatively, the plurality of cell transistors may be arranged on a fringe substrate, which has a $\{110\}$ crystal plane in a growing direction of single crystalline silicon, in the $\{110\}$ crystal plane.

According to some exemplary embodiments of the present invention, the forming of each of the plurality of cell transistors may include sequentially forming a tunnel oxide layer, a floating gate electrode, a dielectric layer and an upper electrode. Alternatively, the forming of each of the plurality of cell transistors may include sequentially forming a tunnel oxide layer, a charge trapping layer pattern, a dielectric layer and an upper electrode.

According to some exemplary embodiments of the present invention, the upper surface of the second substrate may be convexed in a direction substantially the same as the extending direction of the plurality of cell transistors.

Alternatively, the upper surface of the second substrate may be convexed in a direction substantially perpendicular to the extending direction of the plurality of cell transistors.

According to some exemplary embodiments of the present invention, the attaching of the first substrate and the second substrate to each other comprises providing an adhesive between the second surface of the first substrate and the bent upper surface of the second substrate. For example, the adhesive includes an epoxy resin.

According to exemplary embodiments of the present invention, the semiconductor device may include the first substrate having the plurality of cell transistors, and the second substrate having the bent upper surface in the extending direction of the plurality of cell transistors. Thus, the mobility of carriers in an active region of the plurality of cell transistors may be improved by attaching the first substrate to the bent upper surface of the second substrate.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS OF THE INVENTION

Figure 1:
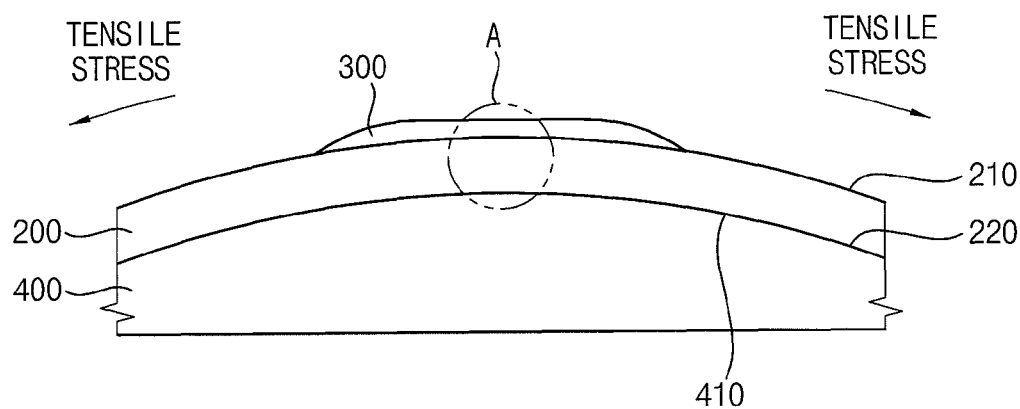
FIG. 1 is a cross-sectional view illustrating a semiconductor device in accordance with an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the exemplary embodiments of the present invention will be explained in detail with reference to the accompanying drawings.

Figure 2:
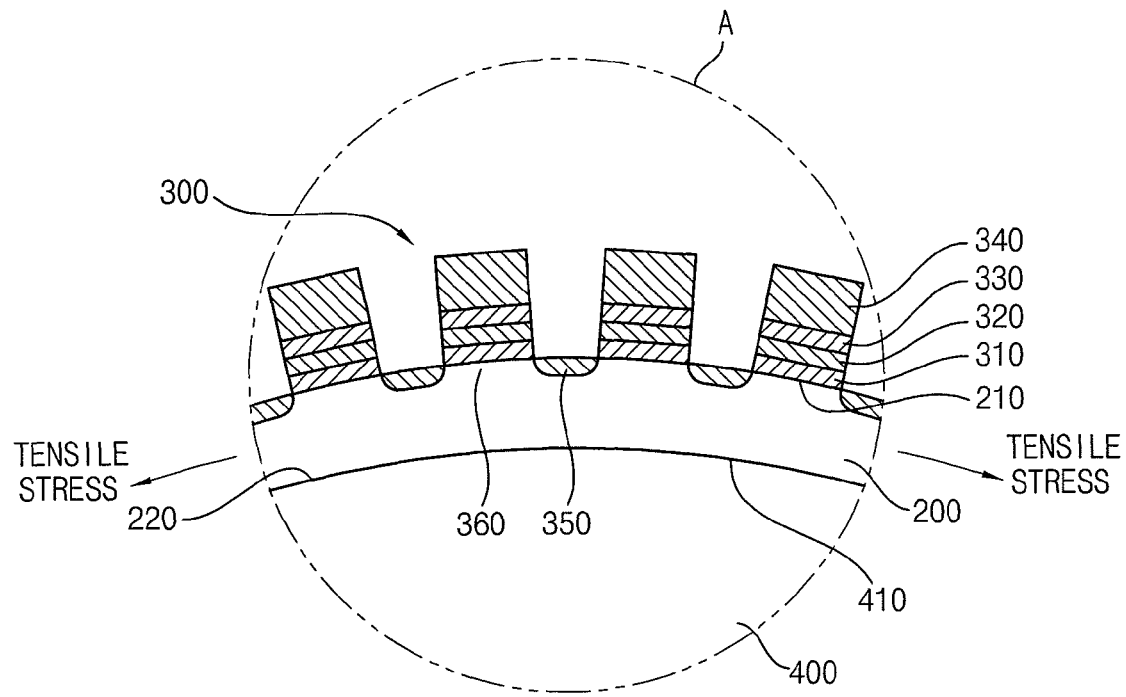
FIG. 2 is an enlarged cross-sectional view of a portion A in FIG. 1.

FIG. 1 is a cross-sectional view illustrating a semiconductor device in accordance with a first exemplary embodiment of the present invention, and FIG. 2 is an enlarged cross-sectional view of a portion "A" in FIG. 1.

Referring to FIGS. 1 and 2, a semiconductor device 100 of this exemplary embodiment includes a first substrate 200, a plurality of cell transistors 300 formed on the first substrate 200 and a second substrate 400 for supporting the first substrate 200 by fixing the first substrate 200 to a bent upper surface of the second substrate 400.

In this exemplary embodiment, the first substrate 200 is prepared. The first substrate 200 may have a first surface 210, and a second surface 220 opposite to the first surface 210.

For example, the first substrate 200 may include a silicon substrate, a silicon-germanium substrate, and the like. Further, the first substrate 200 may include a substrate, a fringe substrate, and the like having a {100} crystal plane in a growing direction of single crystalline silicon. Here, the mobility of carriers in the fringe substrate 200 having the {100} crystal plane may be relatively high so that electron induction may be improved due to a fringe electric field. Alternatively, the first substrate 200 may include a fringe substrate having a {110} crystal plane in a growing direction of single crystalline silicon. Here, the growing direction of the single crystalline silicon in the fringe substrate having the {110} crystal plane may be perpendicular to a forming direction of a channel region in the cell transistors 300.

The cell transistors 300 are formed on the first surface 210 of the first substrate 200. In this exemplary embodiment, the cell transistors 300 may be arranged extending in a direction to have a string structure. For example, when the first substrate 200 includes the substrate or the fringe substrate having the {100} crystal plane, the cell transistors 300 may have a string structure arranged in the {100} crystal plane. Alternatively, when the first substrate 200 includes the fringe substrate having the {110} crystal plane, the cell transistors 300 may have a string structure arranged in the {110} crystal plane.

In this exemplary embodiment, each of the cell transistors 300 may include a first insulating layer pattern 310, a charge storing layer pattern 320, a second insulating layer pattern 330 and a conductive layer pattern 340.

The first insulating layer pattern 310 may be formed on the first surface 210 of the first substrate 200. For example, the first insulating layer pattern 310 may be formed by forming a first insulating layer on the first surface 210 of the first substrate 200, and by patterning the first insulating layer. Here, the first insulating layer pattern 310 may correspond to a tunnel oxide layer pattern. Further, the first insulating layer pattern 310 may include silicon oxide. Alternatively, the first insulating layer pattern 310 may include a material having a dielectric constant higher than that of the silicon oxide. For example, the first insulating layer pattern 310 may be formed by a thermal oxidation process to have a thickness of about 20 Å to about 80 Å. Alternatively, the first insulating layer pattern 310 may be formed by a chemical vapor deposition (CVD) process, an atomic layer deposition (ALD) process, etc.

The charge storing layer pattern 320 may be formed on the first insulating layer pattern 310. For example, the charge storing layer pattern 320 may be formed by forming a charge trapping layer on the first insulating layer pattern 310, and by patterning the charge trapping layer.

In this exemplary embodiment, the charge storing layer pattern 320 may include, for example, polysilicon, amorphous silicon, and the like. Further, the charge storing layer pattern 320 may be formed by a low pressure chemical vapor deposition (LPCVD) process to have a thickness of about 20 Å to about 120 Å. Here, the charge storing layer pattern 320 may correspond to a floating gate electrode.

In other exemplary embodiments, the charge storing layer pattern 320 may include silicon nitride, for example, trisilicon tetranitride ($Si_3N_4$). Further, the charge storing layer pattern 320 may be formed by, for example, an LPCVD process to have a thickness of about 20 Å to about 100 Å. Alternatively, the charge storing layer pattern 320 may include a material having a dielectric constant higher than that of the silicon nitride. The material having the high dielectric constant may include, for example, metal oxide, metal oxynitride, metal silicon oxide, metal silicon oxynitride, and the like. For example, the material having the high dielectric constant may include hafnium, zirconium, tantalum, and the like. Further, the charge storing layer pattern 320 may include, for example, a silicon-rich oxide layer, a silicon nanocrystal layer, and the like. Furthermore, the charge storing layer pattern 320 may include, for example, a laminate structure where the silicon-rich oxide layer and the silicon nano-crystal layer are alternately stacked. Here, the charge storing layer pattern 320 may correspond to a charge trapping layer pattern.

The second insulating layer pattern 330 may be formed on the charge storing layer pattern 320. In this exemplary embodiment, the second insulating layer pattern 330 may be formed by forming a second insulating layer on the charge storing layer pattern 320, and by patterning the second insulating layer. Here, the second insulating layer pattern 330 may correspond to a dielectric layer pattern.

In this exemplary embodiment, the second insulating layer pattern 330 may include, for example, silicon oxide. Alternatively, the second insulating layer pattern 330 may include, for example, a stack structure where a silicon oxide layer, a silicon nitride layer and a silicon oxide layer are sequentially stacked. Further, the second insulating layer pattern 330 may include, for example, a metal oxide layer having a high dielectric constant. Examples of the metal oxide layer may include but is not limited to a tantalum oxide layer, a titanium oxide layer, a hafnium oxide layer, a zirconium oxide layer, a hafnium silicate layer, a zirconium silicate layer, and the like. These layers may be used alone or in a combination thereof.

In some exemplary embodiments, the second insulating layer pattern 330 may serve as to electrically insulate between the charge storing layer pattern 320 and the conductive layer pattern 340. For example, the second insulating layer pattern 330 may include aluminum oxide. Further, the second insulating layer pattern 330 may be formed by, for example, a CVD process, an ALD process, and the like. For example, the second insulating layer pattern 330 may have a thickness of about 100 Å to about 400 Å.

Alternatively, the second insulating layer pattern 330 may include, for example, silicon oxide, silicon oxynitride, or a material having a dielectric constant higher than that of the silicon oxide. For example, the second insulating layer pattern 330 may include metal oxide, metal oxynitride, metal silicon oxide, metal silicon oxynitride, and the like.

The conductive layer pattern 340 may be formed on the second insulating layer pattern 330. In this exemplary embodiment, the conductive layer pattern 340 may be formed by forming a conductive layer on the second insulating layer pattern 330, and by patterning the conductive layer. Here, the conductive layer pattern 340 may correspond to an upper electrode.

In this exemplary embodiment, the conductive layer pattern 340 may include, for example, metal oxide, metal nitride, metal oxynitride, and the like. Further, the conductive layer pattern 340 extends in a direction substantially perpendicular to a forming direction of a channel region that will be illustrated later.

In some exemplary embodiments, the conductive layer pattern 340 may be formed by, for example, a CVD process, an ALD process, a physical vapor deposition (PVD) process, etc., to have a thickness of about 200 Å. For example, the conductive layer pattern 340 may include metal silicide. Examples of the metal silicide may include but are not limited to tungsten silicide, tantalum silicide, cobalt silicide, titanium silicide, and the like.

In this exemplary embodiment, each of the cell transistors may further include source/drain regions 350 and the channel region 360.

The source/drain regions 350 may be formed at the first surface 210 of the first substrate 200 adjacent to the first insulating layer pattern 310, the charge storing layer pattern 320, the second insulating layer pattern 330 and the conductive layer pattern 340. For example, the source/drain regions 350 may be formed by implanting impurities into the first surface 210 of the first substrate 200 adjacent to sidewalls of the above-mentioned structure.

The channel region 360 is formed between the adjacent source/drain regions 350. Thus, when a voltage is applied to the cell transistor, carriers in the source region may be moved into the drain region and vice versa. Charges may be stored/erased in/from the charge storing layer pattern 320 by the movement of the carriers. In this exemplary embodiment, when the semiconductor device 100 includes a NAND flash memory device, the cell transistors 300 may correspond to an n-type metal oxide semiconductor (NMOS) transistor so that the carriers may correspond to an electron.

As a result, the cell transistors 300, which include the first insulating layer pattern 310, the charge storing layer pattern 320, the second insulating layer pattern 330, the conductive layer pattern 340, the source/drain region 350 and the channel region 360, are formed on the first surface 210 of the first substrate 200.

The second substrate 400 is prepared. In this exemplary embodiment, the second substrate 400 may include a printed circuit board (PCB) having conductive wirings. The conductive wirings of the second substrate may transmit a voltage, which is applied to the second substrate 400, to the first substrate 200 and/or the cell transistors 300. Alternatively, the second substrate 400 may include a die for supporting the first substrate 200. That is, the second substrate 400 may only support the first substrate 200 without conductive wirings.

In this exemplary embodiment, the second substrate 400 may have a bent upper surface 410. For example, a central portion of the upper surface 410 in the second substrate 400 may have a bent shape such as a convex bow. For example, the upper surface 410 of the second substrate 400 may be convexed in a direction substantially the same as the extending direction of the cell transistors 300. Here, the extending direction of the cell transistors 300 may be substantially the same as the forming direction of the channel region 360. Further, the extending direction of the cell transistors 300 and the forming direction of the channel region 360 may correspond to a string direction of the cell transistors 300. That is, the central upper surface 410 of the second substrate 400 with which the first substrate 200 makes contact may have the convex shape in the forming direction of the channel region 360 or the string direction of the cell transistors 300.

The bent upper surface 410 of the second substrate 400 makes contact with the second surface 220 of the first substrate 200 to support the first substrate 200. For example, the first substrate 200 and the second substrate 400 may be attached to each other using an adhesive. As a result, the first substrate 200 may be fixed to the bent upper surface 410 of the second substrate 400.

In this exemplary embodiment, as the upper surface 410 of the second substrate 400 is bent into a rounded shape, the first substrate 200 fixed to the second substrate 400 may be also bent into a rounded shape corresponding to that of the second substrate 400. For example, a central portion of the first substrate 200 may have a convex shape corresponding to the bent central upper surface 410 of the second substrate 400. That is, the first substrate 200 on the second substrate 400 may have a wholly bent shape having the convex central portion.

In this exemplary embodiment, when the second substrate 400 and/or the first substrate 200 has the bent shape, tensile stresses may be applied to the first substrate 200 in the extending direction of the cell transistors 300. For example, the tensile stresses may be applied to the first substrate 200 in the forming direction of the channel region 360. As mentioned above, when the semiconductor device 100 includes the NAND flash memory device, the mobility of the carriers in the channel region 360 may be significantly improved owing to the tensile stresses applied to the channel region 360.

For example, when the first substrate 200 is bent in the forming direction of the channel region 360, the tensile stresses may be applied in both end directions of the cell transistors having the string structure. Here, the tensile stresses may be generated in the channel region 360 of the cell transistors 300 to widen an interval between lattice structures of the first substrate 200. Therefore, the electrons in the channel region 360 may be readily moved between the lattice structures of the first substrate 200. Further, the cell transistors 300 may have an increased capacitance due to the improved mobility of the carriers in the channel region 360. For example, when the voltage is applied to both ends and/or one end of the cell transistors 300 serially arranged, the voltage may be transmitted to all of the cell transistors 300. Thus, the mobility of the carriers may be improved to increase cell currents. As a result, the cell transistors 300 may have improved operational characteristics.

Figure 3:
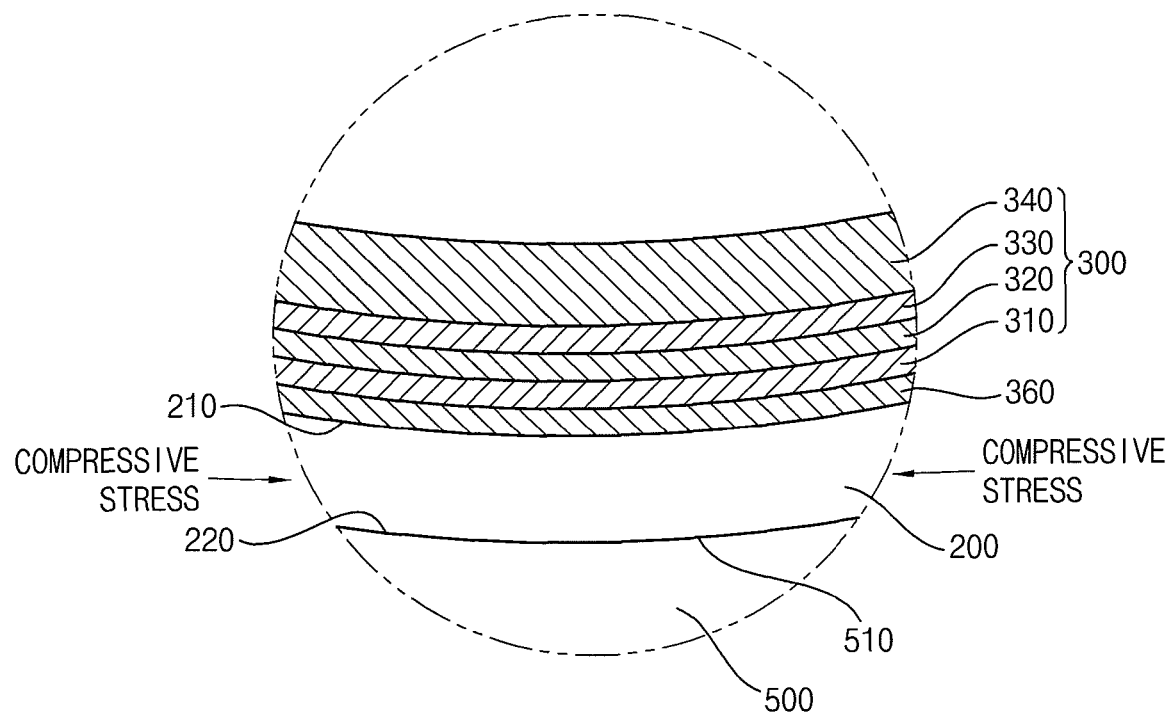
FIG. 3 is a partially enlarged cross-sectional view illustrating a semiconductor device in accordance with an exemplary embodiment of the present invention.

FIG. 3 is a partially enlarged cross-sectional view illustrating a semiconductor device in accordance with a second exemplary embodiment of the present invention. Here, the semiconductor device of this exemplary embodiment includes elements substantially the same as those of the semiconductor device in FIG. 1 except for a bent direction of the first substrate and/or the second substrate. Thus, the elements in the present exemplary embodiment which are the same as those of the semiconductor device of FIG. 1 will be referred to using the same reference numerals as used in FIG. 1 and any further illustrations with respect to those same elements are omitted herein for brevity.

Referring to FIG. 3, the semiconductor device of this exemplary embodiment includes the first substrate 200, the cell transistors 300 formed on the first substrate 200, and a second substrate 500 located under the first substrate 200.

The first substrate 200 is prepared. In this exemplary embodiment, the first substrate 200 may include a fringe substrate having a {100} crystal plane that may have a high mobility of electrons.

The cell transistors 300 are formed on the first substrate 200. In this exemplary embodiment, each of the cell transistors 300 may include the first insulating layer pattern 310, the charge storing layer pattern 320, the second insulating layer pattern 330, the conductive layer pattern 340, the source/drain regions 350 and the channel region 360. Further, the cell transistors 300 may extend on the first surface 210 of the first substrate 200 along a direction.

The second substrate 500 is prepared. In this exemplary embodiment, the second substrate 500 may include a PCB.

According to this exemplary embodiment, the second substrate 500 may have a bent upper surface. For example, a central portion of the upper surface 510 in the second substrate 500 may have a bent shape such as a concave bow. For example, the upper surface 510 of the second substrate 500 may be concaved in a direction substantially the same as the extending direction of the cell transistors 300. Here, the extending direction of the cell transistors 300 may be substantially the same as the forming direction of the channel region 360. Thus, the central upper surface 510 of the second substrate 500 may be concaved in a direction substantially perpendicular to the forming direction of the channel region 360. Further, the forming direction of the channel region 360 may correspond to a string direction of the cell transistors 300. Thus, the central upper surface 510 of the second substrate 500 may have the concave shape in a direction substantially perpendicular to the string direction of the cell transistors 300.

The bent upper surface 510 of the second substrate 500 makes contact with the second surface 220 of the first substrate 200 to support the first substrate 200. For example, the first substrate 200 and the second substrate 500 may be attached to each other using an adhesive. As a result, the first substrate 200 may be fixed to the bent upper surface 510 of the second substrate 500.

In this exemplary embodiment, as the upper surface 510 of the second substrate 500 is bent into a rounded shape, the first substrate 200 fixed to the second substrate 500 may be also bent into a rounded shape corresponding to that of the second substrate 500. For example, a central portion of the first substrate 200 may have a convex shape corresponding to the bent central upper surface 510 of the second substrate 500. That is, the first substrate 200 on the second substrate 500 may have a downwardly bent shape having the concave central portion.

In this exemplary embodiment, when the second substrate 500 has the concave bent shape, compressive stresses may be applied to the first substrate 200 in a direction substantially perpendicular to the extending direction of the cell transistors 300. For example, the compressive stresses may be applied to the first substrate 200 in the direction substantially perpendicular to the forming direction of the channel region 360. When the compressive stresses are generated in the first substrate 200 in the direction substantially perpendicular to the forming direction of the channel region 360, tensile stresses may be generated in the forming direction of the channel region 360. That is, as the upper surface 510 of the second substrate 500 is concaved in the direction substantially perpendicular to the forming direction of the channel region 360, the compressive stresses may be generated in the direction substantially perpendicular to the forming direction of the channel region 360 and the tensile stresses may also be generated in the forming direction of the channel region 360. Therefore, the mobility of the carriers in the channel region 360 may be significantly improved so that the cell capacitance of the cell transistors 300 may be increased.

Figure 4:
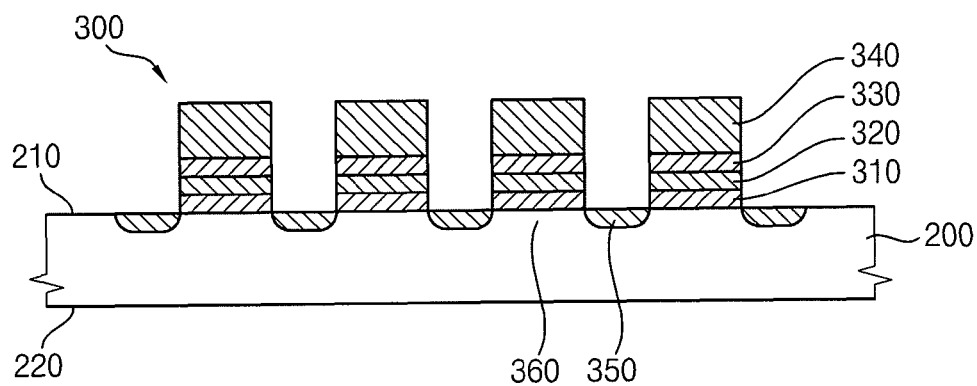
FIGS. 4 to 6 are cross-sectional views illustrating a method of manufacturing the semiconductor device in FIG. 1.
Figure 5:
Figure 6:
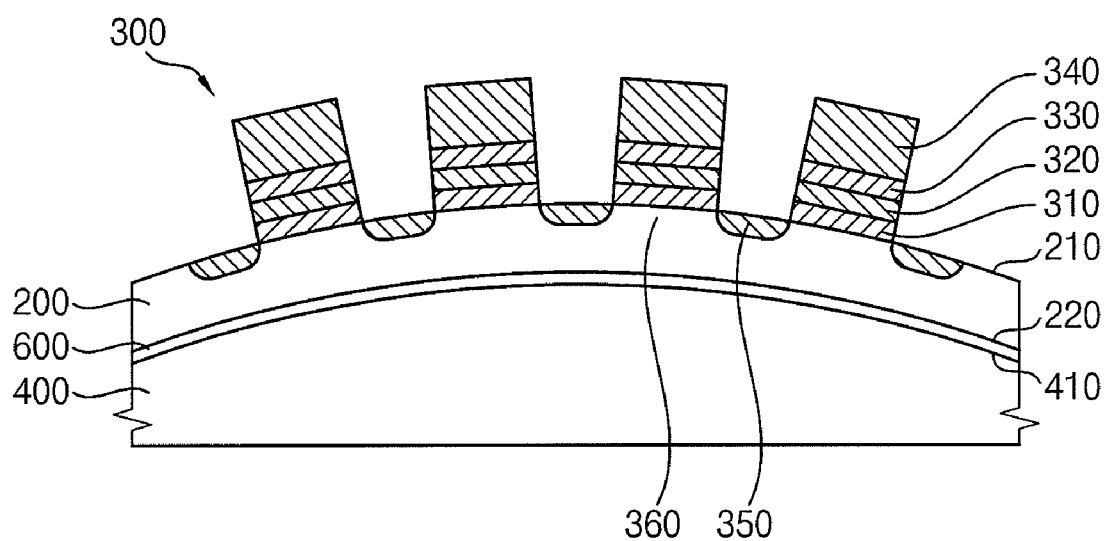

FIGS. 4 to 6 are cross-sectional views illustrating a method of manufacturing the semiconductor device in FIG. 1.

Referring to FIG. 4, the cell transistors 300 are formed on the first substrate 200.

In this exemplary embodiment, the first substrate 200 is prepared. The first substrate 200 may include a fringe substrate having a {100} crystal plane in a growing direction of single crystalline silicon. Here, the mobility of the carriers in the fringe substrate 200 having the {100} crystal plane may be relatively high so that electron induction may be improved due to a fringe electric field. Alternatively, the first substrate 200 may include a fringe substrate having a {110} crystal plane.

The cell transistors 300 are formed on the first surface 210 of the first substrate 200. In this exemplary embodiment, when the first substrate 200 includes the fringe substrate having the {100} crystal plane, the cell transistors 300 may be arranged in the {100} direction. Alternatively, when the first substrate 200 includes the fringe substrate having the {110} crystal plane, the cell transistors 300 may be arranged in the {110} direction.

In this exemplary embodiment, each of the cell transistors 300 may include a first insulating layer pattern 310, a charge storing layer pattern 320, a second insulating layer pattern 330 and a conductive layer pattern 340.

A first insulating layer, a charge storing layer, a second insulating layer and a conductive layer are sequentially formed on the first surface 210 of the first substrate 200. The first insulating layer, the charge storing layer, the second insulating layer and the conductive layer are patterned to form the first insulating layer pattern 310, the charge storing layer pattern 320, the second insulating layer pattern 330 and the conductive layer pattern 340.

Here, the first insulating layer pattern 310 may correspond to the tunnel oxide layer. The charge storing layer pattern 320 may correspond to the floating gate electrode and the charge trapping layer pattern. The second insulating layer pattern 330 may correspond to the dielectric layer. The conductive layer pattern 340 may correspond to the upper electrode.

For example, the first insulating layer pattern 310 may be formed by a thermal oxidation process to have a thickness of about 20 Å to about 80 Å. Alternatively, the first insulating layer pattern 310 may be formed by, for example, a chemical vapor deposition (CVD) process, an atomic layer deposition (ALD) process, etc. The first insulating layer pattern 310 may include, for example, silicon oxide. Alternatively, the first insulating layer pattern 310 may include a material having a dielectric constant higher than that of the silicon oxide.

Further, the charge storing layer pattern 320 may be formed by, for example, a low pressure chemical vapor deposition (LPCVD) process to have a thickness of about 20 Å to about 120 Å. The charge storing layer pattern 320 may include, for example, polysilicon, amorphous silicon, and the like.

In other exemplary embodiments, the charge storing layer pattern 320 may be formed by an LPCVD process to have a thickness of about 20 Å to about 100 Å. For example, the charge storing layer pattern 320 may include silicon nitride, for example, trisilicon tetranitride ($Si_3N_4$). Alternatively, the charge storing layer pattern 320 may include a material having a dielectric constant higher than that of the silicon nitride. The material having the high dielectric constant may include, for example, metal oxide, metal oxynitride, metal silicon oxide, metal silicon oxynitride, and the like. For example, the material having the high dielectric constant may include hafnium, zirconium, tantalum, and the like.

The second insulating layer pattern 330 may be formed by, for example, a CVD process, an ALD process, and the like. In this exemplary embodiment, the second insulating layer pattern 330 may include, for example, silicon oxide. Alternatively, the second insulating layer pattern 330 may include, for example, a stack structure where a silicon oxide layer, a silicon nitride layer and a silicon oxide layer are sequentially stacked. Further, the second insulating layer pattern 330 may include, for example, a metal oxide layer having a high dielectric constant.

In some exemplary embodiments, the second insulating layer pattern 330 may be formed by, for example, a CVD process, an ALD process, and the like to have a thickness of about 100 Å to about 400 Å. Further, the second insulating layer pattern 330 may include, for example, aluminum oxide. Alternatively, the second insulating layer pattern 330 may include, for example, silicon oxide, silicon oxynitride, or a material having a dielectric constant higher than that of the silicon oxide.

In some exemplary embodiments, the conductive layer pattern 340 may be formed on the second insulating layer pattern 330 by, for example, a CVD process using metal oxide, metal nitride, metal oxynitride, etc.

Alternatively, the conductive layer pattern 340 may be formed by, for example, a CVD process, an ALD process, a physical vapor deposition (PVD) process, etc., to have a thickness of about 200 Å. For example, the conductive layer pattern 340 may include metal silicide. Examples of the metal silicide may include but are not limited to tungsten silicide, tantalum silicide, cobalt silicide, titanium silicide, and the like.

The source/drain regions 350 and the channel region 360 are formed at the upper surface 210 of the first substrate 200.

In this exemplary embodiment, the source/drain regions 350 may be formed at the first surface 210 of the first substrate 200 adjacent to the first insulating layer pattern 310, the charge storing layer pattern 320, the second insulating layer pattern 330 and the conductive layer pattern 340. For example, the source/drain regions 350 may be formed by implanting impurities into the first surface 210 of the first substrate 200 adjacent to sidewalls of the above-mentioned structure.

The channel region 360 is formed between the adjacent source/drain regions 350. Thus, when a voltage is applied to the cell transistor, carriers in the source region may be moved into the drain region and vice versa.

As a result, the cell transistors 300, which include the first insulating layer pattern 310, the charge storing layer pattern 320, the second insulating layer pattern 330, the conductive layer pattern 340, the source/drain region 350 and the channel region 360, are formed on the first surface 210 of the first substrate 200.

Referring to FIG. 5, the second substrate 400 having the bent upper surface 410 is prepared. In this exemplary embodiment, the central portion of the upper surface 410 in the second substrate 400 may have a bent shape such as, for example, a convex bow. For example, the upper surface 410 of the second substrate 400 may be convexed in a direction substantially the same as the extending direction of the cell transistors 300. Here, the extending direction of the cell transistors 300, the forming direction of the channel region 360 and the string direction of the cell transistors 300 may be substantially the same. Thus, the central upper surface 410 of the second substrate 400 may have the convex shape in the forming direction of the channel region 360 or the string direction of the cell transistors 300.

In this exemplary embodiment, the second substrate 400 may be prepared after preparing the first substrate 200 and the cell transistors 300. However, the preparations of the first substrate 200, the cell transistors 300 and the second substrate 400 may not be restricted within the above-mentioned sequence. Alternatively, the first substrate 200 and the cell transistors 300 may be prepared after forming the second substrate 400.

Referring to FIG. 6, the first substrate 200 and the second substrate 400 are attached to each other. In this exemplary embodiment, the first substrate 200 may be placed on the upper surface 410 of the second substrate 400. The first substrate 200 may then be fixed to the upper surface 410 of the second substrate 400. For example, the second surface 220 of the first substrate 200 may be attached to the upper surface 410 of the second substrate 400 using an adhesive 600 such as, for example, an epoxy resin. Alternatively, the first substrate 200 and the second substrate 400 may be attached to each other using other adhesives as well as the epoxy resin.

In this exemplary embodiment, when the first substrate 200 is fixed to the bent upper surface 410 of the second substrate 400, tensile stresses may be applied to the first substrate 200 in the extending direction of the cell transistors 300. For example, the tensile stresses may be applied in both forming directions of the channel region 360 in the first substrate 200. Thus, the tensile stresses may be generated in the channel region 360. As a result, the mobility of the carriers may be significantly improved due to the tensile stresses applied to the channel region 360.

Figure 7:
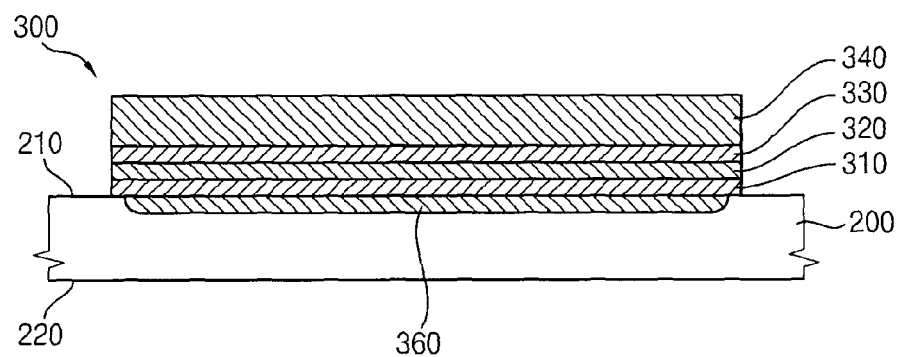
FIGS. 7 to 9 are cross-sectional views illustrating a method of manufacturing the semiconductor device in FIG. 3.
Figure 8:
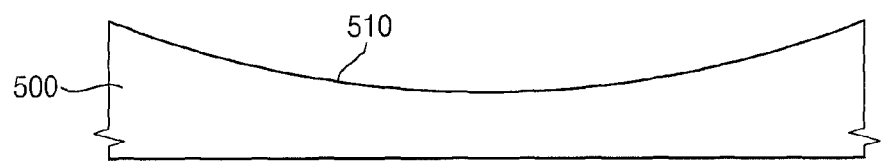
Figure 9:
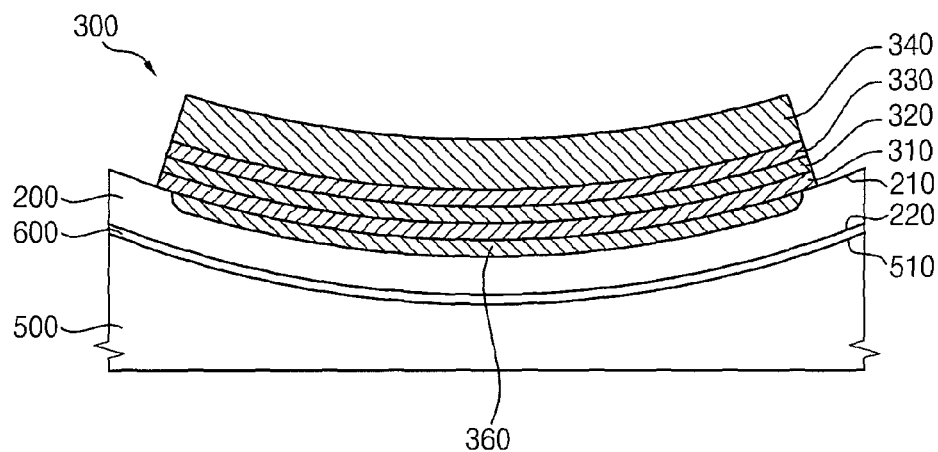

FIGS. 7 to 9 are cross-sectional views illustrating a method of manufacturing the semiconductor device in FIG. 3.

Referring to FIG. 7, the cell transistors 300 are formed on the first surface 210 of the first substrate 200. In this exemplary embodiment, each of the cell transistors 300 may include a first insulating layer pattern 310, a charge storing layer pattern 320, a second insulating layer pattern 330 and a conductive layer pattern 340.

Referring to FIG. 8, the second substrate 500 having the bent upper surface 510 is prepared. In this exemplary embodiment, the central portion of the upper surface 510 in the second substrate 500 may have a concave shape such as, for example, a convex bow. For example, the upper surface 510 of the second substrate 500 may be concaved in a direction substantially perpendicular to the extending direction of the cell transistors 300. Here, the extending direction of the cell transistors 300, the forming direction of the channel region 360 and the string direction of the cell transistors 300 may be substantially the same. Thus, the central upper surface 510 of the second substrate 500 may have the concave shape in the direction substantially perpendicular to the forming direction of the channel region 360 or the string direction of the cell transistors 300.

In this exemplary embodiment, the second substrate 500 may be prepared after preparing the first substrate 200 and the cell transistors 300. However, the preparations of the first substrate 200, the cell transistors 300 and the second substrate 500 may not be restricted within the above-mentioned sequence. Alternatively, the first substrate 200 and the cell transistors 300 may be prepared after forming the second substrate 500.

Referring to FIG. 9, the first substrate 200 and the second substrate 400 are attached to each other. In this exemplary embodiment, the first substrate 200 may be placed on the upper surface 510 of the second substrate 500. The first substrate 200 may then be fixed to the upper surface 510 of the second substrate 500. For example, the second surface 220 of the first substrate 200 may be attached to the upper surface 510 of the second substrate 500 using an adhesive 600 such as, for example, an epoxy resin. Alternatively, the first substrate 200 and the second substrate 400 may be attached to each other using other adhesives as well as the epoxy resin.

In this exemplary embodiment, when the first substrate 200 is fixed to the bent upper surface 510 of the second substrate 500, the compressive stresses may be applied to the first substrate 200 in the direction substantially perpendicular to the extending direction of the cell transistors 300. For example, the compressive stresses may be applied to the first substrate 200 in the direction substantially perpendicular to the forming direction of the channel region 360. Thus, as the compressive stresses may be applied in the direction substantially perpendicular to the forming direction of the channel region 360, the tensile stresses may be applied in both forming directions of the channel region 360 in the first substrate 200. Thus, the tensile stresses may be generated in the channel region 360. As a result, the mobility of the carriers may be significantly improved due to the tensile stresses applied to the channel region 360.

According to some exemplary embodiments of the present invention, the first substrate may be attached to the convex upper surface of the second substrate in the forming direction of the channel region or the concave upper surface of the second substrate in the direction substantially perpendicular to the forming direction of the channel region. When the first substrate has the bent shape corresponding to that of the upper surface of the second substrate, the tensile stresses may be generated in the channel region of the first substrate. As a result, the mobility of the carriers in the channel region may be improved so that the cell current in the cell transistors may be increased.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
   a first substrate having a first surface and a second surface opposite to the first surface;
   a plurality of cell transistors extending on the first surface of the first substrate in a direction, wherein the plurality of cell transistors each include source and drain regions and a channel region formed between the source and drain regions in the first substrate; and
   a second substrate having an upper surface that makes contact with the second surface of the first substrate, the upper surface of the second substrate having a bent shape to apply tensile stresses to the first substrate in the extending direction of the plurality of cell transistors and to the channel region, and wherein the second substrate is formed underneath the first substrate having the plurality of cell transistors, and wherein the second substrate includes one of a printed circuit board (PCB) having conductive wirings or a die for supporting the first substrate.

2. The semiconductor device of claim 1, wherein the first substrate comprises a fringe substrate having a {110} crystal plane in a growing direction of single crystalline silicon.

3. The semiconductor device of claim 1, wherein the first substrate comprises a fringe substrate having a {100} crystal plane in a growing direction of single crystalline silicon.

4. The semiconductor device of claim 3, wherein the plurality of cell transistors have string structure arranged along the {100} crystal plane.

5. The semiconductor device of claim 1, wherein each of the plurality of cell transistors comprises a tunnel oxide layer, a floating gate electrode, a dielectric layer and an upper electrode sequentially stacked .

6. The semiconductor device of claim 5, wherein the source and drain regions formed in the first substrate are located adjacently to the tunnel oxide layer, the floating gate electrode, the dielectric layer and the upper electrode.

7. The semiconductor device of claim 1, wherein each of the plurality of cell transistors comprises a tunnel oxide layer, a charge trapping layer pattern, a dielectric layer and an upper electrode sequentially stacked.

8. The semiconductor device of claim 7, wherein the source and drain regions formed in the first substrate are located adjacently to the tunnel oxide layer, the charge trapping layer pattern, the dielectric layer and the upper electrode 9. The semiconductor device of claim 1, wherein the second substrate comprises the a printed circuit board (PCB) having conductive wirings.

10. The semiconductor device of claim 1, wherein the bent upper surface of the second substrate has a convex shape in a direction substantially the same as the extending direction of the plurality of cell transistors.

11. The semiconductor device of claim 10, wherein the first substrate formed on the second substrate has a wholly bent shape having a convex central portion.

12. The semiconductor device of claim 1, wherein the bent upper surface of the second substrate has a concave shape in a direction substantially perpendicular to the extending direction of the plurality of cell transistors.

13. The semiconductor device of claim 12, wherein the first substrate formed on the second substrate has a downwardly bent shape having a concave central portion.

14. The semiconductor device of claim 1, wherein the first substrate has a bent shape corresponding to the bent shape of the upper surface of the second substrate.

15. The semiconductor device of claim 1, wherein the semiconductor device includes a NAND flash memory device and wherein the plurality of cell transistors correspond to an n-type metal oxide semiconductor (NMOS).

16. The semiconductor device of claim 1, wherein the extending direction of the cell transistors is substantially the same as a forming direction of the channel region, the extending direction of the cell transistors and the forming direction of the channel region correspond to a string direction of the cell transistors, and wherein the upper surface of the second substrate which makes contact with the first substrate has a convex shape in the forming direction of the channel region and the string region of the cell transistors.

17. The semiconductor device of claim 1, wherein the extending direction of the cell transistors, a forming direction of the channel region, the extending direction and a string direction of the cell transistors are substantially the same, and wherein the upper surface of the second substrate which makes contact with the first substrate has a concave shape in a direction substantially perpendicular to the forming direction of the channel region and the string region of the cell transistors.

* * * * *